United States Patent
Wollesen

[11] Patent Number: 6,146,985
[45] Date of Patent: Nov. 14, 2000

[54] LOW CAPACITANCE INTERCONNECTION

[75] Inventor: Donald L. Wollesen, Saratoga, Calif.

[73] Assignee: Advanced Micro Devices, Inc., Sunnyvale, Calif.

[21] Appl. No.: 09/070,912

[22] Filed: May 4, 1998

Related U.S. Application Data

[62] Division of application No. 08/564,998, Nov. 30, 1995, Pat. No. 5,900,668.

[51] Int. Cl.[7] .................................................. H01L 21/4763
[52] U.S. Cl. ............................. 438/618; 438/619; 438/620; 438/622; 438/623; 438/624
[58] Field of Search ............................... 438/622, 623, 438/624, 618, 763, 619, 625, 620; 257/522

[56] References Cited

U.S. PATENT DOCUMENTS

| | | | |
|---|---|---|---|
| 3,890,638 | 6/1975 | Harada et al. | 257/752 |
| 4,017,886 | 4/1977 | Tomono et al. | 257/643 |
| 4,933,305 | 6/1990 | Kikkawa | 438/120 |
| 5,034,799 | 7/1991 | Tomita et al. | 257/758 |
| 5,227,013 | 7/1993 | Kumar | 216/18 |
| 5,376,586 | 12/1994 | Beilin et al. | 427/496 |
| 5,413,962 | 5/1995 | Lur et al. | 438/619 |
| 5,534,731 | 7/1996 | Cheung | 257/759 |
| 5,598,028 | 1/1997 | Losavio et al. | 257/644 |
| 5,612,914 | 3/1997 | Liu et al. | 257/315 |
| 5,654,570 | 8/1997 | Agnello | 257/338 |
| 5,670,828 | 9/1997 | Cheung et al. | 257/773 |
| 5,708,303 | 1/1998 | Jeng | 257/758 |

FOREIGN PATENT DOCUMENTS

2247986   3/1992   United Kingdom ................... 257/758

*Primary Examiner*—Carl Whitehead, Jr.
*Assistant Examiner*—Maria Gurrero

[57] ABSTRACT

A semiconductor device having reduced parasitic capacitance and, consequentially increased integrated circuit speed, is achieved by removing sections of dielectric interlayers which do not support conductive patterns, as by anisotropic etching, to form air gaps which can remain or are filled in with a dielectric material having a low dielectric constant. In another embodiment, a conformal dielectric coating is deposited, having a low dielectric constant.

25 Claims, 5 Drawing Sheets

LOW CAPACITANCE INTERCONNECTION

This application is a division of application Ser. No. 08/564,998 filed Nov. 30, 1995 now U.S. Pat. No. 5,900,668.

TECHNICAL FIELD

The present invention relates to a semiconductor device with reduced capacitance loading, and to a method of manufacturing the semiconductor device. The invention has particular application in semiconductor devices comprising submicron dimensions.

BACKGROUND ART

The escalating requirements for high density and performance associated with ultra large scale integration semiconductor wiring require integrated circuits of greater complexity with minimal feature sizes and spacings in the submicron range. High performance microprocessor applications require rapid speed of semiconductor circuitry. The control speed of semiconductor circuitry varies inversely with the resistance and capacitance of the interconnection pattern.

As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

Conventional integrated circuit technology basically comprises a semiconductor substrate, typically silicon, an insulating or dielectric layer on the silicon substrate, and a conductive layer comprising conductive patterns formed on the dielectric layer. Typically, a plurality of sequential dielectric and conductive layers are deposited in accordance with the design characteristics of a particular integrated circuit. The various conductive patterns of different conductive layers are electrically connected by vias or plugs, while the conductive patterns of the first conductive layer are electrically connected to active regions in the semiconductor substrate by contacts.

Figure 1:
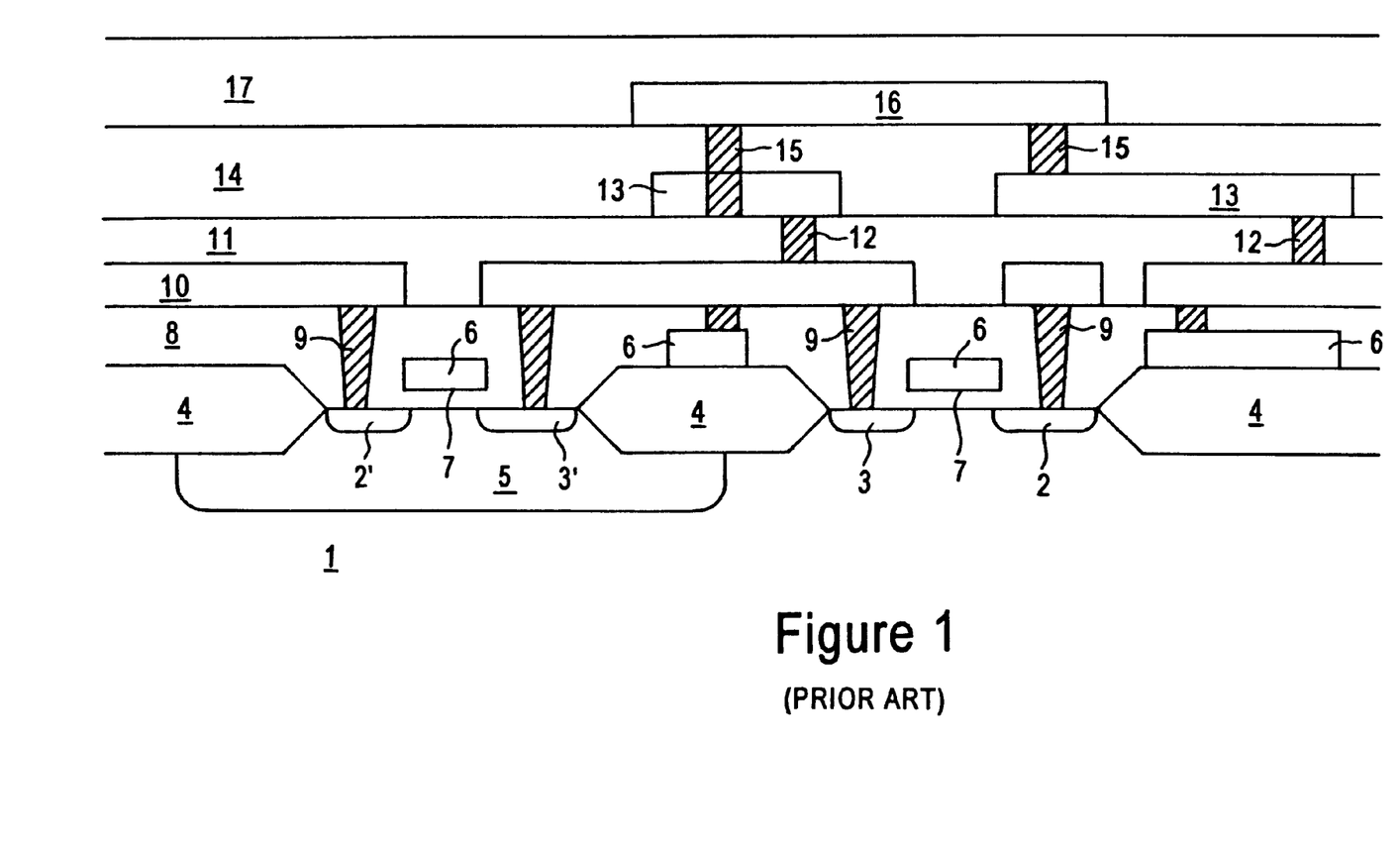
FIG. 1 schematically depicts a cross-sectional view of a conventional semiconductor device comprising a plurality of sequentially formed dielectric and conductive layers.

A conventional semiconductor device is schematically depicted in FIG. 1 and typically comprises a P-type semiconductor substrate 1 having active regions comprising source 2, 2' and drain 3, 3' regions isolated by a field oxide region 4. Also shown is N-type well 5, and gate electrodes 6, typically comprising polycrystalline silicon, spaced apart from the active regions by gate oxide 7. First dielectric layer 8 comprises a plurality of contacts 9 for electrically connecting the active regions 2, 2' and 3, 3' with conductive patterns of first conductive layer 10. Second dielectric layer 11 comprises a plurality of vias/plugs 12 for electrically connecting conductive patterns of the first conductive layer 10 with conductive patterns of the second conductive layer 13. Third dielectric layer 14 comprises a plurality of vias/plugs 15 for electrically connecting second conductive layer 13 to third conductive layer 16. A topside or protective dielectric layer 17 is then formed. The final conductive layer, such as third conductive layer 16, is typically joined to a bonding pad (not shown) for forming an external electrical connection and, hence, characterized as the wire bonding layer. The topside protective layer prevents contamination of the semiconductor device during assembling and provides resistance to moisture and chemical attack.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. Moreover, a low cost satisfactory method for joining a bonding pad to copper for external connection has yet to be developed. Furthermore, copper does not form a passivation film, as does aluminum. Hence, a separate passivation layer is required to protect copper from corrosion.

The dielectric constant of materials currently employed in the manufacture of semiconductor devices for dielectric interlayers spans from about 3.5 for dense silicon dioxide to over 8 for deposited silicon nitride and spin-on glass. Prior art attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, teflon, aerogels and porous polymers have been developed. There has been some use of certain polyimide materials for interlayer dielectrics which have a dielectric constant slightly below 3.0. However, polyimides in contact with aluminum, the typical metal employed for conductive patterns, create moisture/bias reliability problems.

There have been attempts to address the high capacitance interconnection problem by forming air bridges or air tunnels, such as disclosed in copending application Ser. No. 08/391,692 (our docket no. 1033-091 filed Feb. 21, 1995). These techniques, however, require a considerable number of manipulative processing steps which are not only time consuming but expensive in terms of required equipment and materials. Moreover, the use of air bridges significantly reduces the structural integrity of the semiconductor device, since the conductive patterns are not provided with adequate underlying support.

Tomita et al., U.S. Pat. No. 5,034,799, disclose a semiconductor device based upon a gallium arsenide substrate, rather than silicon, wherein studs are employed and dielectric material is removed from under conductive patterns. The disclosed semiconductor device also exhibits inadequate structural integrity.

Thus, there exists a need for a semiconductor device, and method of manufacturing a semiconductor device, which exhibits a reduced interconnection capacitance and structural integrity in a simplified, cost effective manner.

DISCLOSURE OF THE INVENTION

An object of the present invention is a semiconductor device having an interconnection structure exhibiting reduced interconnection capacitance and structural integrity.

Another object is a method of manufacturing a semiconductor device having an interconnection structure with reduced capacitance and structural integrity.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a semiconductor substrate; a dielectric layer formed on the semiconductor substrate; and a conductive layer, comprising at least one conductive pattern, formed on the dielectric layer; wherein the dielectric layer comprises a portion of a first dielectric material only substantially under each conductive pattern.

Another aspect of the present invention is a semiconductor device comprising: a semiconductor substrate; and a plurality of sequentially formed dielectric and conductive layers, each conductive layer comprising at least one conductive pattern; wherein each dielectric layer comprises a portion of a first dielectric material only substantially under each conductive pattern of the conductive layer formed thereon.

A further aspect of the present invention is a semiconductor device comprising: a semiconductor substrate; a plurality of sequentially formed dielectric and conductive layers thereon, each conductive layer comprising at least one conductive pattern; wherein, each dielectric layer comprises a portion of a first dielectric material substantially only under each conductive pattern of the conductive layer formed thereon, and air spaces between and adjoining each portion of the first dielectric material.

Another aspect of the present invention is a semiconductor device comprises: a semiconductor substrate; a dielectric layer formed on the semiconductor substrate; and a conductive layer, comprising at least one conductive pattern, formed on the dielectric layer; wherein sections of the dielectric layer have been removed except for a portion of dielectric material substantially under a conductive pattern.

A further aspect of the present invention is a method of manufacturing a semiconductor device, which method comprises: sequentially depositing a plurality of dielectric and conductive layers on a semiconductor substrate, wherein each dielectric layer comprises a first dielectric material and each conductive layer comprises at least one conductive pattern; and removing sections of each dielectric layer leaving only a portion of the first dielectric material substantially under each conductive pattern of the conductive layer thereon.

Another aspect of the present invention is a method of manufacturing a semiconductor device, which method comprises: sequentially depositing a plurality of dielectric and conductive layers on a semiconductor substrate, wherein each dielectric layer comprises a first dielectric material and each conductive layer comprises at least one conductive pattern; removing sections of each dielectric layer leaving only a portion of the first dielectric material substantially under each conductive pattern of the conductive layer thereon; and depositing a second dielectric material in each dielectric layer between and adjoining the remaining portions of a first dielectric material; wherein the second dielectric material has a dielectric constant less than the dielectric constant of the first dielectric material.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention comprises a simplified, cost effective manner in which to increase the integrated circuit speed of highly integrated semiconductor devices, particularly a semiconductor device having submicron circuitry, by significantly reducing the capacitance of the interconnection pattern. Basically, the present invention commences where conventional practices terminate. Specifically, the present invention begins with a conventionally formed semiconductor device as depicted in FIG. 1, prior to integrating the FIG. 1 device into a circuit. Thus, the practice of the present invention initially involves conventional manufacturing procedures to produce the semiconductor device schematically depicted in FIG. 1.

The present invention comprises selectively removing the sections of dielectric material from each dielectric layer, initially formed of a first dielectric material, leaving a portion of the first dielectric material only substantially under each conductive pattern of the conductive layer formed on the dielectric layer for structural support. This simplified, cost effective technique can be accomplished by employing anisotropic etching, such as a conventional plasma etch, to remove sections of the dielectric layers which are not substantially under conductive patterns. Typically, dielectric layers are formed of oxides and nitrides, such as silicon oxide and silicon nitride. In accordance with the present invention, anisotropic etching can be timed or determined using a conventional end point detection technique at a conductive layer. In conducting anisotropic etching, it is preferred to anisotropically etch all dielectric layers in one etching stage to increase processing throughput.

The anisotropic etching techniques employed in practicing the present invention, do not remove significant amounts of conductive material, typically conductive employed in interconnection patterns. Such typical conductive materials include aluminum, polysilicon and refractory metals. The present invention, however, is not limited to any particular dielectric materials as the first dielectric material, or to any particular conductive material, but includes copper, copper-based alloys, gold, gold-based alloys, silver, silver-based alloys, aluminum, aluminum-based alloys, refractory metals, refractory metal alloys, refractory metal compounds and superconducting materials.

Thus, in accordance with the present invention, sections of the first dielectric material are removed from the dielectric levels of a multilevel semiconductor device, thereby leaving air spaces between and adjoining portions of first dielectric material remaining only substantially directly under each conductive pattern of the overlying conductive layer. Such remaining portions of first dielectric material advantageously provide mechanical support for the overlying conductive patterns. The air spaces, however, significantly reduce the overall capacitance of the interconnection pattern, since air has a dielectric constant approaching 1. Air spaces also exist between the conductive patterns of the conductive layers. Thus, in submicron technologies wherein adjacent wiring capacitances are generally high, the present invention enables a significant reduction of the dominant capacitance.

Figure 2:
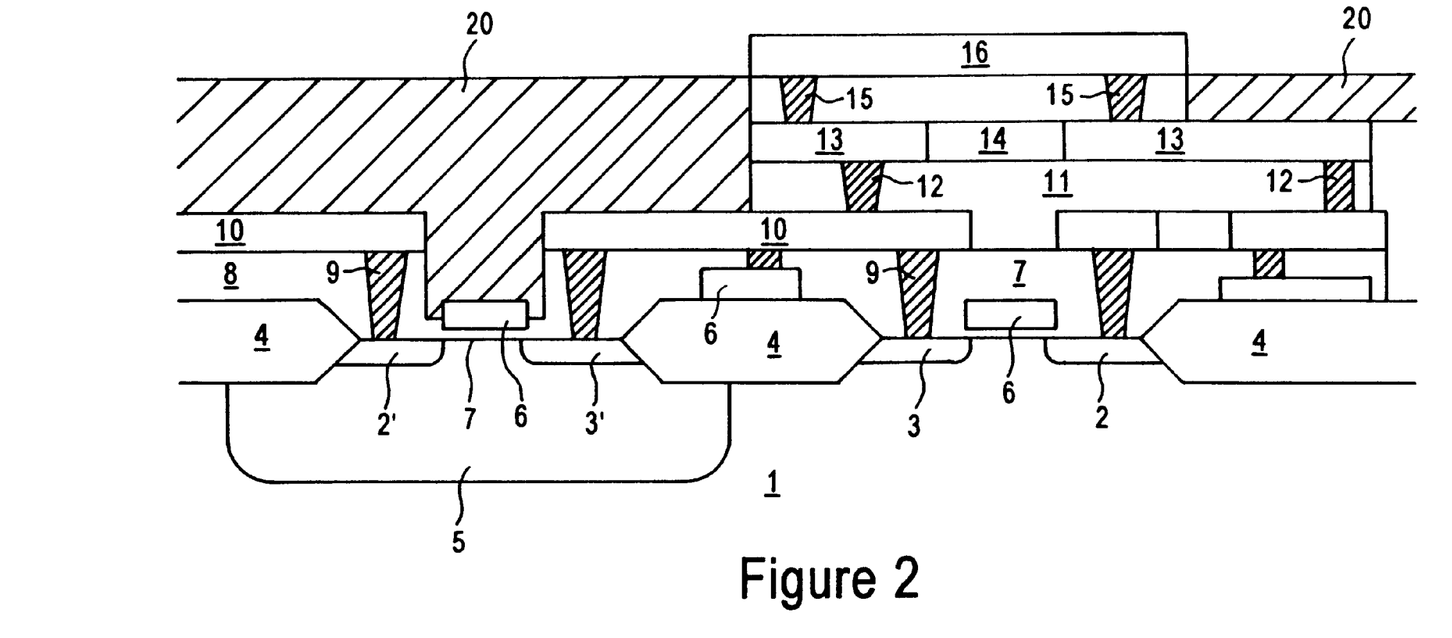
FIG. 2 schematically depicts a cross-sectional view of a semiconductor device formed in accordance with the present invention wherein sections of the dielectric layers have been removed.

In accordance with the present invention, a multilayer semiconductor device is provided comprising at least one dielectric layer and a conductive layer having a conductive pattern formed thereon in accordance with conventional practices. Typically, a conductive pattern comprises a plurality of conductive spaced apart lines. Preferably, the conventionally formed semiconductor device comprises a plurality, e.g., at least two sequentially formed dielectric and conductive layers (three layers are shown in FIG. 1). A semiconductor device in that stage of fabrication is then treated in accordance with the present invention, as by anisotropic etching, to remove sections of the dielectric material of the initially formed dielectric layers, i.e., the first dielectric material, leaving only portions thereof under the conductive patterns formed thereon, as shown in FIG. 2. The elements of the thus treated device depicted in FIG. 2 similar to those of the FIG. 1 device bear similar reference numerals.

Figure 3:
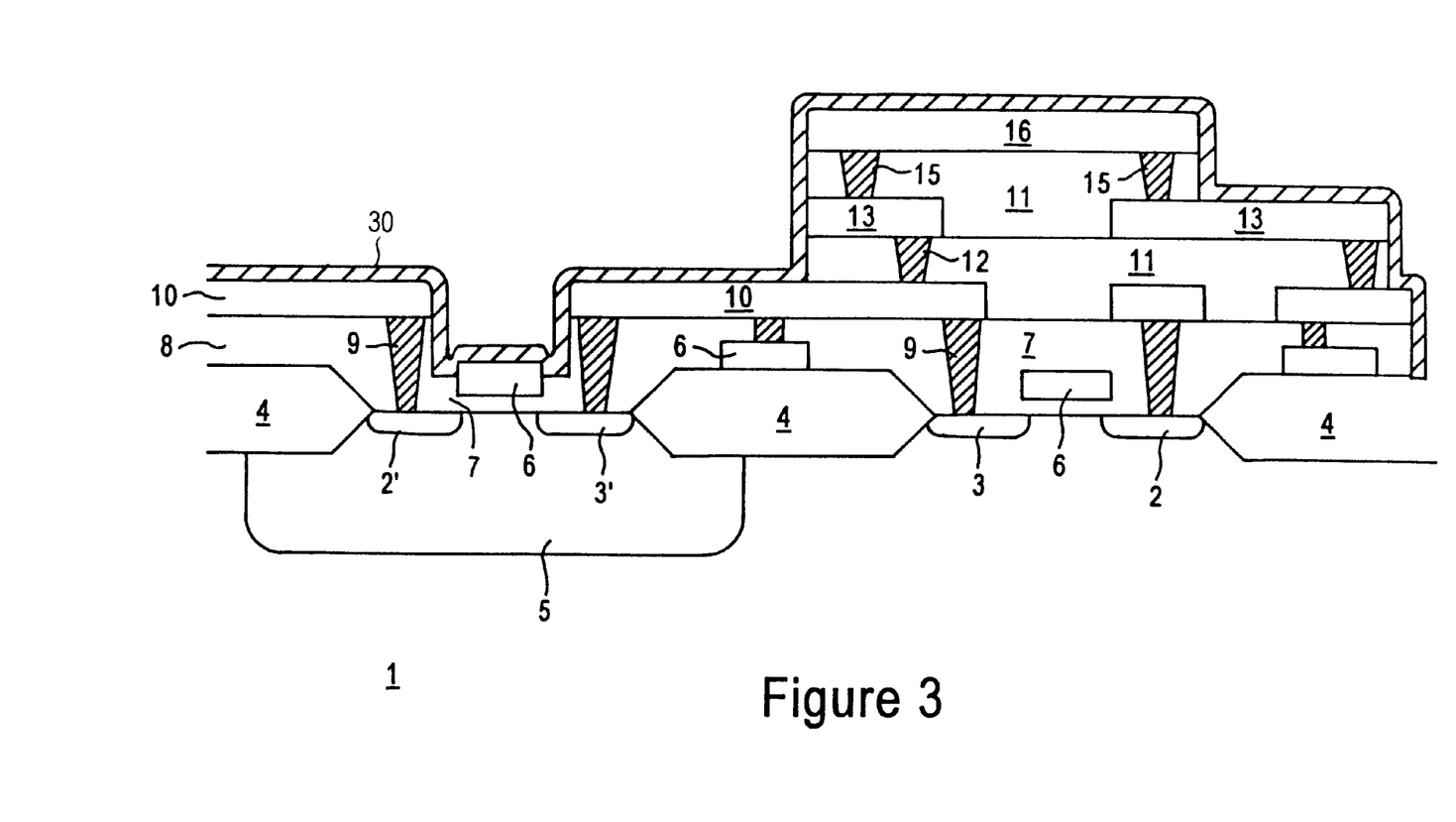
FIG. 3 schematically depicts another embodiment of the present invention wherein a conformal dielectric layer is applied.

As shown in FIG. 2, sections of each dielectric layer are removed as by anisotropic etching, leaving air spaces 20 and remaining portions of first dielectric material supporting the conductive patterns on overlying conductive layers. The resulting semiconductor device with an interconnection pattern having reduced capacitance due to the presence of air spaces can be plastically encapsulated in accordance with conventional practices. However, upon plastically encapsulating a semiconductor structure such as that depicted in FIG. 2, the edges of some of the conductive layers would be exposed, which can pose a reliability problem. Accordingly, in accordance with another embodiment of the present invention, a thin conformal dielectric coating is deposited subsequent to anisotropic etching, thereby reducing the possibility of reliability problems stemming from exposed conductive patterns. Thus, the semiconductor device subsequent to anisotropic etching, as depicted in FIG. 2, is then further processed in accordance with this embodiment by depositing a thin conformal dielectric coating 30 as shown in FIG. 3, wherein elements similar to those in FIGS. 1 and 2 bear similar reference numerals.

The thickness of the thin conformal dielectric coating depends, of course, upon design requirements and engineering needs. One of the design considerations is that the space between interconnects separated by air may have leakage or arcing problems if sufficient voltage is applied. This is because air cannot withstand as much electric field as solid insulators such as $SiO_2$. The thin dielectric coating of the present invention will improve the voltage capability of the interconnection. Typically, a conformal dielectric coating having a thickness ranging from a few hundred to several thousand Angstroms is suitable. Subsequent processing can be conducted in a conventional manner, as by employing a pad mask to form a contact to wire bonding layer 16. A portion of the thin conformal dielectric coating would then be removed to enable external connection.

A thin conformal dielectric coating in accordance with the present invention, can comprise any dielectric material conventionally employed in the manufacture of semiconductor devices, such as a silicon oxide, silicon nitride or silicon oxynitride. The use of a silicon oxide will provide a lower dielectric constant; however, silicon oxynitrides and silicon nitrides offer greater reliability.

In accordance with another embodiment of the present invention, a thin polyimide or other dielectric organic material conformal layer is deposited, prior to or subsequent to deposition of the thin conformal dielectric coating. When employing conductive patterns comprising aluminum, a thin polyimide conformal coating is preferably deposited on a first conformal dielectric layer to avoid contact with aluminum.

In another embodiment of the present invention, the air spaces formed between and adjoining remaining portions of the first dielectric material are replaced with a second dielectric material having a dielectric constant lower than the dielectric constant of the first dielectric material. For example, in producing a semiconductor device in accordance with the present invention by removing sections of the dielectric layers comprising silicon dioxide wherein silicon dioxide, as the first dielectric material, remains only substantially under overlying conductive patterns, the resulting spaces between and adjoining such remaining portions of silicon dioxide are filled with a topside coating comprising a dielectric material having a lower dielectric constant than silicon dioxide, such as a low dielectric constant polyimide. Thus, in this embodiment, rather than applying a thin conformal dielectric layer, a complete topside layer of dielectric material having a dielectric constant lower than the dielectric constant of the first dielectric material is applied, as by spin-on techniques, such as spin-on glass (SOG) or other organic dielectrics, as in FIG. 4.

Figure 4:
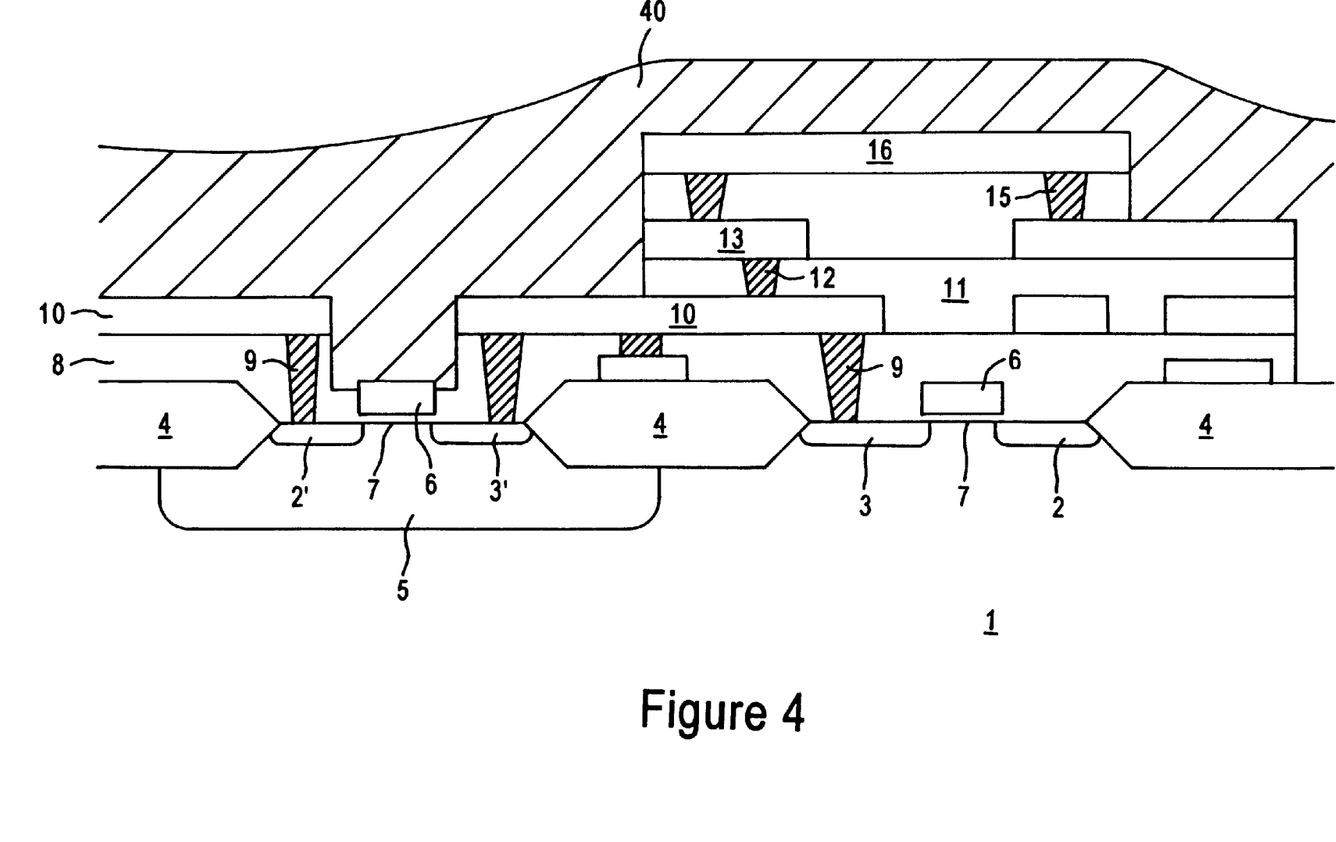
FIG. 4 schematically illustrates another embodiment of the present invention.

As shown in FIG. 4, after anisotropic etching to remove sections of each dielectric layer (FIG. 2), further processing is conducted comprising applying a film of dielectric material 40, such as a spin-on film, thereby filling in the air spaces created by anisotropic etching. The elements of the device depicted in FIG. 4 similar to those depicted in FIGS. 1, 2 and 3 bear similar reference numerals.

In the embodiment depicted in FIG. 4, the capacitance of the interconnection pattern is greater than the capacitance of the interconnection pattern of the devices depicted in FIGS. 2 and 3. However, the capacitance of the interconnection pattern of the FIG. 4 device is advantageously lower than the capacitance of the interconnection pattern of the conventional FIG. 1 device, since the filled in film 40 exhibits a dielectric constant less than the dielectric constant of the first dielectric material removed in accordance with the practice of the present invention. Such filled in dielectric material preferably comprises a low dielectric constant polyimide, which has a lower dielectric constant than that of silicon dioxide.

Figure 5:
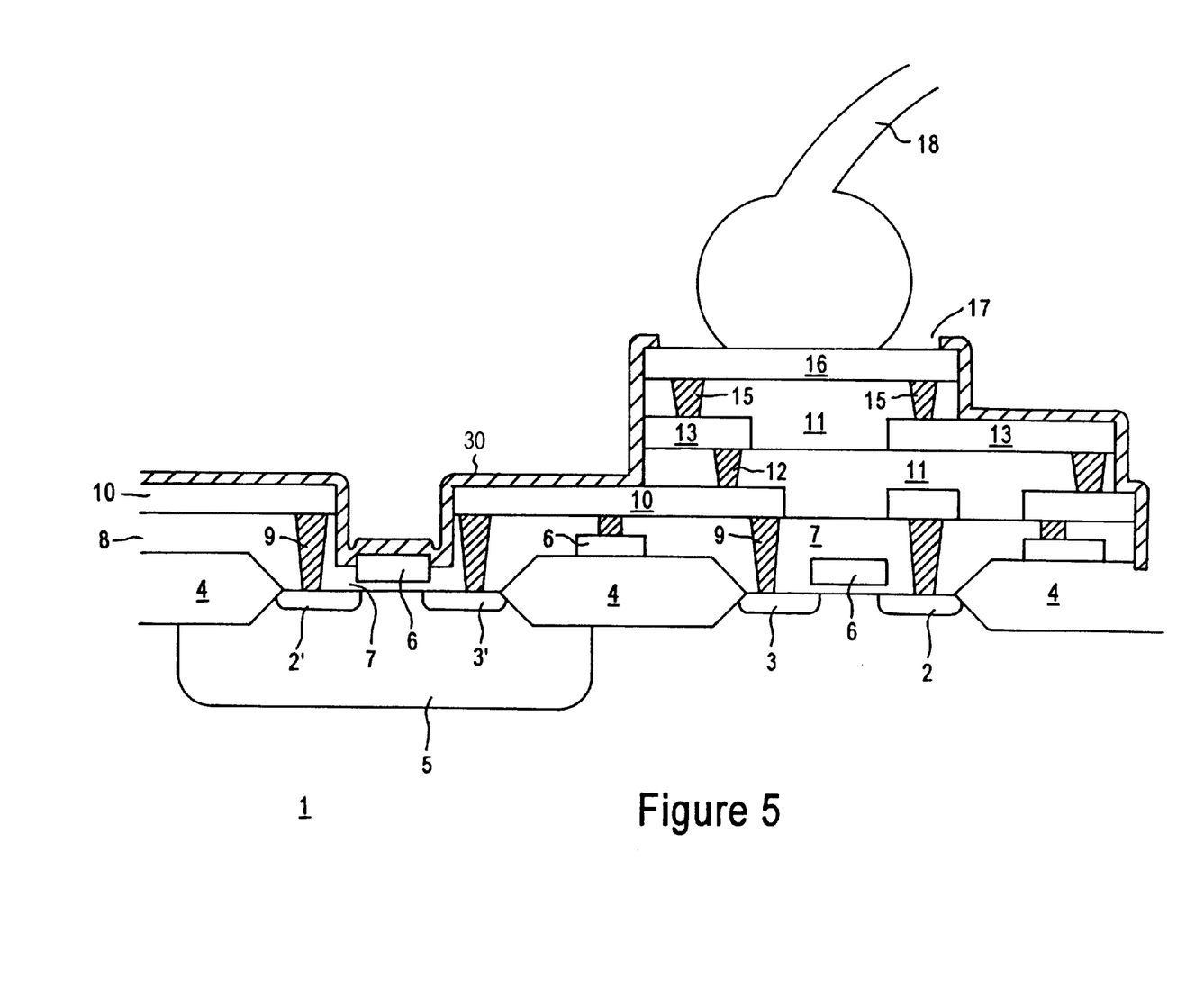
FIG. 5 schematically illustrates a wire bonding embodiment of the present invention.

FIG. 5 shows the implementation of a package interconnection. Elements in FIG. 5 similar to those in FIGS. 1, 2, 3 and 4 bear similar reference numerals. Bond pad opening 17 is added, as to the FIG. 3 embodiment, to indicate the connection of the metal layer (typically aluminum) to the package interconnect means. As shown in FIG. 5, a thermocompression "ball bond" 18 is provided for electrical contact to the product die. Whereas the interconnect capacitance is reduced by removing dielectric material between the interconnect, dielectric material underneath the metal interconnect layer is not removed. This is an advantage, because wire bonding results in the application of large mechanical forces to the bond pad metal during packaging manufacture. It also allows the addition of "bumps" on the die for subsequent "flip chip" assembly or TAB bonding (Tape Automated Bonding). Because the standard metal and dielectric materials remain underneath the bond pad metal on the die, the mechanical support enjoyed by prior art (FIG. 1) is retained, allowing standard manufacturing practices for package assembly to be employed in practicing the present invention without any change. Approaches involving the use of an air bridge require the addition of special mechanical structures, thereby introducing process complexity in order to use standard wire bonding techniques, or requiring modification of standard package manufacturing practices. The assembly bonding advantage of the present invention applies to all embodiments.

In another embodiment of the present invention, a topside dielectric coating is applied after applying a thin conformal dielectric coating. Preferably, but not necessarily, the topside coating comprises a dielectric material with a dielectric constant less than that of the thin conformal dielectric coating. Preferably, the topside dielectric coating comprises a low dielectric constant polyimide, and the thin conformal dielectric coating comprises a silicon oxide, silicon nitride or a silicon oxynitride.

Thus, in accordance with the present invention, a semiconductor device is formed comprising at least one, preferably a plurality of sequentially formed dielectric and conductive layers, wherein each conductive layer comprises at least one conductive pattern, and each dielectric layer comprises a portion of a first dielectric material only substantially under each conductive pattern of the conductive layer thereon, thereby providing mechanical support and integrity. The thus formed semiconductor device comprises air spaces between and adjoining each portion of the remaining first dielectric material of each dielectric layer, thereby significantly reducing the capacitance of the interconnection pattern. In another embodiment, one or more thin dielectric conformal coatings can be applied to avoid exposure of portions of the metal patterns, thereby improving reliability. In another embodiment, the air spaces between the remaining portions of first dielectric material are filled in with a topside coating comprising a second dielectric material. Preferably, the second dielectric material of each layer is the same and, hence, applied in one step. Preferably, the first dielectric material comprises a silicon oxide, silicon nitride or silicon oxynitride, and the second dielectric material comprises a polyimide or other organic dielectric material.

When applying a thin conformal dielectric coating, it is preferred to employ a silicon oxide, silicon nitride or silicon oxynitride. A topside dielectric layer is preferably formed on the thin conformal dielectric coating comprising a dielectric material having a dielectric constant less than the dielectric constant of the conformal dielectric coating, preferably a topside dielectric layer comprising a polyimide. When applying two conformal dielectric coatings, the second conformal dielectric coating preferably comprises a dielectric material having a dielectric constant less than the dielectric constant of the dielectric material comprising the first conformal dielectric coating.

The semiconductor device produced in accordance with the present invention typically comprises a contact forming an electrical connection between a conductive pattern of the first conductive layer and each active region in the semiconductor device. The semiconductor device produced in accordance with the present invention also comprises a plurality of vias/plugs forming electrical connections between conductive patterns of different conductive layers.

The semiconductor device produced in accordance with the present invention can be manufactured employing conventional photolithographic, etching and deposition techniques. In carrying out the various embodiments of the present invention, conventional metallization techniques can be employed for the deposition of conductive layers, such as various types of chemical vapor deposition (CVD) processes including low pressure chemical vapor deposition (LPCVD), and plasma enhanced chemical vapor deposition (PECVD). Normally, when high melting point metals, such as tungsten are deposited, CVD techniques are employed. Low melting point metals, such as aluminum and aluminum-based alloys, may be deposited by melting or sputtering. Polysilicon can also be employed as a conductive material in the interconnection pattern. The various layers are planarized by known planarization techniques, such as etching and chemical-mechanical polishing techniques.

The various embodiments of the present invention involve the formation of openings, such as vias and trenches, employing conventional photolithographic techniques, including the use of photoresist, mask, etch recipes and etchings techniques, as, for example, plasma etching and reactive ion etching. Various embodiments of the present invention may also employ an etch stop layer, such as a nitride layer, preferably silicon nitride.

The various embodiments of the present invention may comprise the use of damascene techniques, such as single and dual damascene techniques. In dual damascene techniques, vias and trenches are simultaneously filled with conductive material conventionally employed in fabricating interconnection structures, preferably with the use of a barrier layer.

The present invention comprises a conventional semiconductor substrate, such as monocrystalline silicon, and conventional dielectric layers, such as silicon dioxide layers, formed in a conventional manner as by thermal oxidation of a deposited silicon layer, PECVD, thermal enhanced CVD, spin-on techniques, and silicon dioxide derived from deposited tetraethyl orthosilicate (TEOS).

In accordance with the present invention, the performance capabilities and characteristics of a semiconductor device, notably the integrated circuit speed, are improved by reducing the capacitance of an interconnection pattern in a simplified and cost effective manner. The present invention provides semiconductor devices with higher operating speeds by selectively removing sections of interlayer dielectric material except for portions directly supporting overlying conductive patterns. The disclosed embodiments and concepts of the present invention are applicable and any type of semiconductor device comprising interconnection patterns, particularly high density semiconductor devices with submicron circuitry.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises sequentially:

depositing a plurality of dielectric and conductive layers sequentially formed on one another above a semiconductor substrate wherein each dielectric layer comprises a first dielectric material and each conductive layer comprises at least one conductive pattern;

removing sections of each dielectric layer leaving only a portion of the first dielectric material substantially under each conductive pattern of the conductive layer thereon; and depositing a first conformal dielectric coating thereon, wherein each dielectric layer comprises air spaces between and adjoining each portion of the first dielectric material having the first conformal dielectric coating thereon and each conductive level comprises a plurality of conductive patterns separated by air spaces.

2. The method according to claim 1, wherein the first dielectric material is a silicon oxide, silicon nitride or silicon oxynitride.

3. The method according to claim 1, wherein the conformal dielectric coating comprises a silicon oxide, silicon nitride or a silicon oxynitride.

4. The method according to claim 1, further comprising: forming a plurality of vias electrically connecting conductive patterns of conductive layers; and forming a contact electrically connecting a conductive pattern of the first conductive layer and each active region in the semiconductor substrate.

5. The method according to claim 1, wherein the first dielectric material of each dielectric layer is the same.

6. The method according to claim 1, further comprising depositing a topside dielectric layer on the conformal dielectric coating.

7. The method according to claim 1, comprising removing sections of each dielectric layer by anisotropic etching.

8. The method according to claim 6, wherein the topside dielectric layer comprises a polyimide or other organic dielectric.

9. The method according to claim 6, further comprising forming a thermo-compression ball bond for external electrical contact.

10. The method according to claim 7, comprising removing sections of each dielectric layer in a single etching stage.

11. The method according to claim 7, comprising removing sections of each dielectric layer in a single etching stage.

12. A method of manufacturing a semiconductor device, the method comprising sequentially:

depositing a plurality of dielectric and conductive layers sequentially formed on one another above a semiconductor substrate, wherein each dielectric layer comprises a first dielectric material and each conductive layer comprises at least one conductive pattern;

removing sections of each dielectric layer leaving only a portion of the first dielectric material substantially under each conductive pattern of the conductive layer thereon;

depositing a second dielectric material in each dielectric layer between and adjoining the remaining portions of the first dielectric material; wherein the second dielectric material has a dielectric constant less than the dielectric constant of the first dielectric material and depositing a first conformal dielectric coating.

13. The method according to claim 12, wherein the first dielectric material is a silicon oxide, silicon nitride or silicon oxynitride.

14. The method according to claim 12, wherein the second dielectric material is a polyimide or other organic dielectric.

15. The method according to claim 12, wherein the conformal dielectric coating comprises a silicon oxide, silicon nitride or a silicon oxynitride.

16. The method according to claim 12, further comprising depositing a topside dielectric layer on the conformal dielectric coating.

17. The method according to claim 16, wherein the topside dielectric layer comprises a polyimide or other organic dielectric.

18. The method according to claim 12, further comprising: forming a plurality of vias electrically connecting conductive patterns of conductive layers; and forming a contact electrically connecting a conductive pattern of the first conductive layer and each active region in the semiconductor substrate.

19. The method according to claim 12, wherein the first dielectric material of each dielectric layer is the same.

20. The method according to claim 12, comprising removing sections of each dielectric layer by anisotropic etching.

21. The method according to claim 16, further comprising forming a thermo-compression ball bond for external electrical contact.

22. A method of manufacturing a semiconductor device, which method comprises sequentially:

depositing a plurality of dielectric and conductive layers sequentially formed on one another above a semiconductor substrate wherein each dielectric layer comprises a first dielectric material and each conductive layer comprises at least one conductive pattern;

removing sections of each dielectric layer leaving only a portion of the first dielectric material substantially under each conductive pattern of the conductive layer thereon;

depositing a first conformal dielectric coating thereon; and depositing a second conformal dielectric coating on the first conformal dielectric coating; wherein the dielectric constant of the first conformal dielectric coating is less than the dielectric constant of the second conformal dielectric coating.

23. The method according to claim 22, wherein the first conformal dielectric coating comprises a polyimide and the second conformal dielectric coating comprises a silicon oxide, silicon nitride or silicon oxynitride.

24. A method of manufacturing a semiconductor device, the method comprising sequentially:

depositing a plurality of dielectric and conductive layers sequentially formed on one another above a semiconductor substrate, wherein each dielectric layer comprises a first dielectric material and each conductive layer comprises at least one conductive pattern;

removing sections of each dielectric layer leaving only a portion of the first dielectric material substantially under each conductive pattern of the conductive layer thereon;

depositing a second dielectric material in each dielectric layer between and adjoining the remaining portions of the first dielectric material; wherein the second dielectric material has a dielectric constant less than the dielectric constant of the first dielectric material; and depositing a first conformal dielectric coating; and depositing a second conformal dielectric coating thereon; wherein the dielectric constant of the first conformal dielectric coating is less than the dielectric constant of the second conformal dielectric coating.

25. The method according to claim 24, wherein the first conformal dielectric coating comprises a polyimide and the second conformal dielectric coating comprises a silicon oxide, silicon nitride or silicon oxynitride.

* * * * *